US012813224B2

(12) United States Patent
Kim

(10) Patent No.: US 12,813,224 B2
(45) Date of Patent: Nov. 24, 2026

(54) SUBSTRATE PROCESSING APPARATUS AND SUBSTRATE PROCESSING METHOD

(71) Applicant: SEMES CO., LTD., Cheonan-si (KR)

(72) Inventor: Yungi Kim, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 363 days.

(21) Appl. No.: 18/516,750

(22) Filed: Nov. 21, 2023

(65) Prior Publication Data

US 2024/0178047 A1 May 30, 2024

(30) Foreign Application Priority Data

Nov. 30, 2022 (KR) ........................ 10-2022-0164392

(51) Int. Cl.
*H10P 72/76* (2026.01)
*H10P 72/72* (2026.01)

(52) U.S. Cl.
CPC .......... *H10P 72/7612* (2026.01); *H10P 72/72* (2026.01)

(58) Field of Classification Search
CPC .. H10P 72/7162; H10P 72/72; H10P 72/7618; H10P 72/7624
See application file for complete search history.

(56) References Cited

U.S. PATENT DOCUMENTS 6,084,763 A * 7/2000 Hirano ................ H10P 72/0602 279/128
7,292,428 B2 * 11/2007 Hanawa .............. H10P 72/7612 361/234
8,040,655 B2 * 10/2011 Weijiang ................ H02N 13/00 361/234
8,111,499 B2 2/2012 Ni et al.
8,673,166 B2 * 3/2014 Okita ...................... H10P 72/72 118/728
8,714,169 B2 * 5/2014 Lee ..................... H10P 72/7608 134/149
9,892,955 B2 * 2/2018 Kaba ................... H10P 72/7624
10,276,365 B2 * 4/2019 Nishiyama ................ B08B 1/10
(Continued)

FOREIGN PATENT DOCUMENTS

JP 2008-277706 11/2008
KR 10-2006-0077667 7/2006
(Continued)

OTHER PUBLICATIONS

Office Action from the Korean Intellectual Property Office dated Jun. 11, 2024.

*Primary Examiner* — Jason L Vaughan

(57) ABSTRACT

A substrate processing apparatus includes an electrostatic chuck body configured to chuck a substrate using an electrostatic force; a substrate lifting device installed at the electrostatic chuck body and configured to lift the substrate from the electrostatic chuck body; and a controller configured to apply a control signal to the substrate lifting device, wherein the substrate lifting device includes: at least one lift pin movable so as to be in contact with the substrate; a lift pin moving table configured to support the at least one lift pin thereon and to be vertically movable; a moving table lifting device configured to vertically move the lift pin moving table; and a load measurement configured to measure a load applied to the at least one lift pin.

20 Claims, 10 Drawing Sheets

(56) References Cited

U.S. PATENT DOCUMENTS

| | | | | |
|---|---|---|---|---|
| 11,749,555 | B2 * | 9/2023 | Malik ................. | H10P 72/0432<br>118/729 |
| 11,984,344 | B2 * | 5/2024 | Kim .................... | H10P 72/0432 |
| 2021/0013016 | A1 | 1/2021 | Tsuto | |
| 2021/0366750 | A1 | 11/2021 | Sunaba et al. | |
| 2023/0124884 | A1 * | 4/2023 | Jeong .................. | H10P 72/7612<br>414/749.1 |

FOREIGN PATENT DOCUMENTS

| | | |
|---|---|---|
| KR | 10-2008-0012602 | 2/2008 |
| KR | 10-2010-0117528 | 11/2010 |
| KR | 10-2019-0014392 | 2/2019 |
| KR | 10-2021-0006853 | 1/2021 |
| KR | 10-2021-0020592 | 2/2021 |
| KR | 10-2021-0126540 | 10/2021 |

* cited by examiner

SUBSTRATE PROCESSING APPARATUS AND SUBSTRATE PROCESSING METHOD

CROSS-REFERENCE TO RELATED APPLICATION

This application claims priority to and the benefit of Korean Patent Application No. 10-2022-0164392, filed on Nov. 30, 2022, the disclosure of which is incorporated herein by reference in its entirety.

BACKGROUND OF THE DISCLOSURE

1. Field of the Disclosure

The present disclosure relates to a substrate processing apparatus and a substrate processing method, and more specifically, to a substrate processing apparatus and a substrate processing method that enable identification of a de-chucking state of an electrostatic chuck based on a measuring result of a load applied to a lift pin.

2. Description of the Related Art

A substrate processing apparatus for manufacturing a semiconductor device may have an electrostatic chuck (ESC) installed in a chamber to chuck a substrate such as a silicon wafer. This electrostatic chuck allows the substrate to be adsorbed and fixed to an electrostatic chuck surface under an electrostatic force generated by applying a voltage to a built-in electrostatic electrode and may be widely used in high-vacuum environments to which an existing vacuum chuck is not applied.

The electrostatic chuck may include an electrostatic chuck body containing therein the electrostatic electrode, and a heater that heats the substrate, a lift pin that moves the substrate vertically, or a cooling device.

SUMMARY OF THE DISCLOSURE

However, when this conventional electrostatic applies the electrostatic force to chuck the substrate, and when the electrostatic electrode is of a simple monopolar type, residual charges may be generated which prevented the electrostatic chuck from de-chucking the substrate, and the lift pin lifts the substrate while the electrostatic chuck chucks the substrate, thereby causing damage or stress to the substrate.

Furthermore, it is difficult to measure the residual charges in the monopolar type electrostatic chuck. Thus, the de-chucking state thereof may not be identified, especially when a process condition or a chamber condition has changed. Thus, frequent occurrence of the damage to the substrate may lead to seriously damaged reliability of the electrostatic chuck.

The present disclosure is intended to solve several problems including the above-mentioned problems. Thus, a purpose of the present disclosure is to provide a substrate processing apparatus and a substrate processing method in which the substrate is preliminarily raised up before unloading the substrate, and a load applied to a lift pin is measured, and then the de-chucking state is identified based on the measuring result.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means illustrated in the claims and combinations thereof.

According to a first aspect of the present disclosure, a substrate processing apparatus includes an electrostatic chuck body configured to chuck a substrate using an electrostatic force; a substrate lifting device installed at the electrostatic chuck body and configured to ascend such that the substrate is seated thereon in a substrate loading operation, or to lift the substrate from the electrostatic chuck body in a substrate unloading operation; and a controller configured to apply a control signal to the substrate lifting device, wherein the substrate lifting device includes: at least one lift pin movable so as to be in contact with the substrate; a lift pin moving table configured to support the at least one lift pin thereon and to be vertically movable; a moving table lifting device configured to vertically move the lift pin moving table; and a load measurement device installed between the at least one lift pin and the lift pin moving table, or installed between the lift pin moving table and the moving table lifting device, wherein the load measurement device is configured to measure a load applied to the at least one lift pin.

In one implementation of the substrate processing apparatus, before the substrate unloading operation, the controller is configured to apply a preliminarily ascend control signal to the moving table lifting device to preliminarily raise up the lift pin to a de-chucking check vertical level at which a de-chucked state of the substrate is identified.

In one implementation of the substrate processing apparatus, the de-chucking check vertical level is a vertical level within an elastic deformation range of the substrate as a range in which the substrate is raised up such that the substrate is not damaged from a state in which the substrate has been chucked on the electrostatic chuck body.

In one implementation of the substrate processing apparatus, when the at least one lift pin has been preliminarily raised up to the de-chucking check vertical level, the controller is configured to receive load measurement information from the load measurement device, and to compare the load measurement information with a reference value, and to determine the de-chucked state of the substrate based on the comparing result, and to output the determined de-chucked state.

In one implementation of the substrate processing apparatus, when the load measurement information is within a range of the reference value, the controller is configured to determine that de-chucking of the substrate is successful, wherein when the load measurement information exceeds the reference value, the controller is configured to determine that de-chucking of the substrate fails.

In one implementation of the substrate processing apparatus, when the load measurement information is smaller than the reference value, the controller is configured to determine that the substrate has escaped from the electrostatic chuck body.

In one implementation of the substrate processing apparatus, when the load measurement information deviates from the reference value, the controller is configured to apply a lift pin movement stop control signal to the moving table lifting device, and to apply a notification signal to a notification device.

In one implementation of the substrate processing apparatus, in the substrate loading operation, the controller is configured to receive load measurement information from the load measurement device, and to compare the received load measurement information with a reference value, and to determine an aligned state of the substrate based on the comparing result, and to output the determined aligned state of the substrate.

In one implementation of the substrate processing apparatus, the load measurement device includes a load cell or a strain gauge with a resistance pattern whose resistance value changes when being deformed under a load.

In one implementation of the substrate processing apparatus, the at least one lift pin includes a first pin, a second pin, and a third pin arranged triangularly to support the substrate triangularly thereon, wherein the load measurement device includes: a first load cell installed under the first pin; a second load cell installed under the second pin; and a third load cell installed under the third pin, wherein the controller is configured to: compare first load measurement information received from the first load cell, second load measurement information received from the second load cell, and third load measurement information received from the third load cell with one another; determine whether the first load measurement information, the second load measurement information, and the third load measurement information are distributed in an equal manner to one another within an allowed range; determine a presence/absence state, an aligned state, and/or a de-chucked state of the substrate based on the determination result; and output the determined presence/absence state, aligned state, and/or de-chucked state of the substrate.

In one implementation of the substrate processing apparatus, in order to allow the load measurement device to be replaced or removed as necessary under a magnetic force, a first magnet is installed under the lift pin, a second magnet exerting an attractive force toward the first magnet is installed on an upper surface of the load measurement device, a third magnet is installed under a lower surface of the load measurement device, and a fourth magnet exerting an attractive force toward the third magnet is installed on a top face of the lift pin moving table.

According to a second aspect of the present disclosure, a substrate processing method includes (a) loading a substrate onto an elevated substrate lifting device; (b) lowering the substrate lifting device and chucking the substrate onto an electrostatic chuck body using an electrostatic force so that a process is ready to proceed; (c) de-chucking the substrate from the electrostatic chuck body by deactivating the electrostatic force; (d) preliminarily raising up the substrate to a de-chucking check vertical level using the substrate lifting device so that a de-chucked state of the substrate can be identified at the de-chucking check vertical level; and (e) lifting the substrate from the electrostatic chuck body by raising up the substrate lifting device so that the substrate identified as being successfully de-chucked is unloaded from the electrostatic chuck body.

In one implementation of the substrate processing method, the de-chucking check vertical level is a vertical level within an elastic deformation range of the substrate as a range in which the substrate is raised up such that the substrate is not damaged from a state in which the substrate has been chucked on the electrostatic chuck body.

In one implementation of the substrate processing method, the (d) includes, when the at least one lift pin has been preliminarily raised up to the de-chucking check vertical level, receiving load measurement information from the load measurement device, and comparing the load measurement information with a reference value, and determining the de-chucked state of the substrate based on the comparing result, and outputting the determined de-chucked state.

In one implementation of the substrate processing method, the (d) includes: when the load measurement information is within a range of the reference value, determining that de-chucking of the substrate is successful; when the load measurement information exceeds the reference value, the determining that de-chucking of the substrate fails; and when the load measurement information is smaller than the reference value, determining that the substrate has escaped from the electrostatic chuck body.

In one implementation of the substrate processing method, the (d) includes, when the load measurement information deviates from the reference value, applying a lift pin movement stop control signal to the moving table lifting device, and applying a notification signal to a notification device.

In one implementation of the substrate processing method, the (a) includes, in the substrate loading operation, receiving load measurement information from the load measurement device, and comparing the received load measurement information with a reference value, and determining an aligned state of the substrate based on the comparing result, and outputting the determined aligned state of the substrate.

In one implementation of the substrate processing method, the (a) includes: comparing first load measurement information received from a first load cell installed under a first pin, second load measurement information received from a second load cell installed under a second pin, and third load measurement information received from a third load cell installed under a third pin with one another; determining an aligned state of the substrate based on the comparing result; and outputting the determined aligned state of the substrate.

In one implementation of the substrate processing method, the (d) includes: comparing first load measurement information received from a first load cell installed under a first pin, second load measurement information received from a second load cell installed under a second pin, and third load measurement information received from a third load cell installed under a third pin with one another; determining whether the first load measurement information, the second load measurement information, and the third load measurement information are distributed in an equal manner to one another within an allowed range; determining a presence/absence state, an aligned state, and/or a de-chucked state of the substrate based on the determination result; and outputting the determined presence/absence state, aligned state, and/or de-chucked state of the substrate.

According to a third aspect of the present disclosure, a substrate processing apparatus includes an electrostatic chuck body configured to chuck a substrate using an electrostatic force; a substrate lifting device installed at the electrostatic chuck body and configured to ascend such that the substrate is seated thereon in a substrate loading operation, or to lift the substrate from the electrostatic chuck body in a substrate unloading operation; and a controller configured to apply a control signal to the substrate lifting device, wherein the substrate lifting device includes: at least one lift pin movable so as to be in contact with the substrate; a lift pin moving table configured to support the at least one lift pin thereon and to be vertically movable; a moving table lifting device configured to vertically move the lift pin moving table; and a load measurement device installed between the at least one lift pin and the lift pin moving table, or installed between the lift pin moving table and the moving table lifting device, wherein the load measurement device is configured to measure a load applied to the at least one lift pin, wherein before the substrate unloading operation, the controller is configured to apply a preliminarily ascend control signal to the moving table lifting device to preliminarily raise up the lift pin to a de-chucking check vertical level at which a de-chucked state of the substrate is identified, wherein the de-chucking check vertical level is a vertical level within an elastic deformation range of the substrate as a range in which the substrate is raised up such that the substrate is not damaged from a state in which the substrate has been chucked on the electrostatic chuck body, wherein when the at least one lift pin has been preliminarily raised up to the de-chucking check vertical level, the controller is configured to receive load measurement information from the load measurement device, and to compare the load measurement information with a reference value, and to determine the de-chucked state of the substrate based on the comparing result, and to output the determined de-chucked state, wherein when the load measurement information is within a range of the reference value, the controller is configured to determine that de-chucking of the substrate is successful, wherein when the load measurement information exceeds the reference value, the controller is configured to determine that de-chucking of the substrate fails, wherein when the load measurement information is smaller than the reference value, the controller is configured to determine that the substrate has escaped from the electrostatic chuck body, wherein when the load measurement information deviates from the reference value, the controller is configured to apply a lift pin movement stop control signal to the moving table lifting device, and to apply a notification signal to a notification device.

According to various embodiments of the present disclosure as described above, the substrate is preliminarily raised up before unloading the substrate, and the load applied to the lift pin is measured, and then the de-chucking state is identified based on the measuring result. Further, the loads respectively applied to the triangularly arranged lift pins are compared with each other. Upon determination based on the comparing result that the loads are not uniform or one of the loads is not applied, this state may be determined as the substrate escape or absence of the substrate. Thus, the reliability of the substrate processing apparatus may be greatly improved. Effects of the present disclosure are not limited to the effects mentioned above, and other effects not mentioned will be clearly understood by those skilled in the art from the descriptions below.

BRIEF DESCRIPTION OF THE DRAWINGS

The above and other purposes, features and other advantages of the present disclosure will be more clearly understood from the following detailed description taken in conjunction with the accompanying drawings, in which.

DETAILED DESCRIPTION OF THE DISCLOSURE

Figure 1:
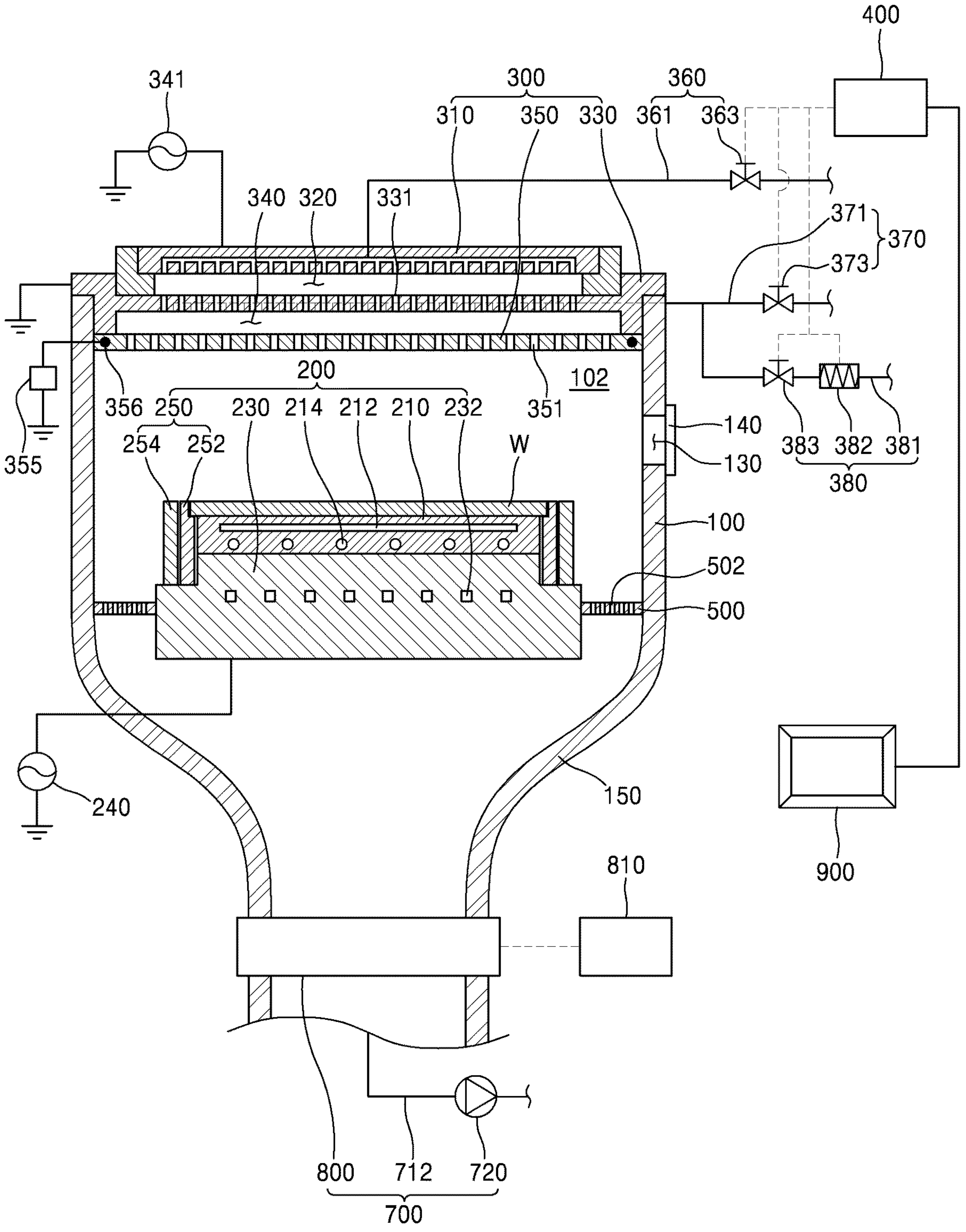
FIG. 1 is a cross-sectional view showing a substrate processing apparatus according to some embodiments of the present disclosure.

Hereinafter, various preferred embodiments of the present disclosure will be described in detail with reference to the attached drawings.

The embodiments of the present disclosure are provided to more completely describe the present disclosure for those skilled in the art. The following embodiments may be modified in various forms, and the scope of the present disclosure is not limited to the following embodiments. Rather, these embodiments are provided so that the present disclosure is thorough and complete, and are provided to fully convey the spirit of the present disclosure to those skilled in the art. Furthermore, a thickness or a size of each layer in the drawing is exaggerated for convenience and clarity of illustration. A shape, a size, a ratio, an angle, a number, etc. disclosed in the drawings for describing embodiments of the present disclosure are illustrative, and the present disclosure is not limited thereto. The same reference numerals refer to the same elements herein.

The terminology used herein is directed to the purpose of describing particular embodiments only and is not intended to be limiting of the present disclosure. As used herein, the singular constitutes “a” and “an” are intended to include the plural constitutes as well, unless the context clearly indicates otherwise. It will be further understood that the terms “comprise”, “comprising”, “include”, and “including” when used in this specification, specify the presence of the stated features, integers, operations, elements, and/or components, but do not preclude the presence or addition of one or more other features, integers, operations, elements, components, and/or portions thereof.

Hereinafter, embodiments of the present disclosure will be described with reference to drawings schematically showing ideal embodiments of the present disclosure. In the drawings, variations of a depicted shape may be expected, depending, for example, on manufacturing techniques and/or tolerances. Therefore, the embodiments of the present disclosure should not be construed as being limited to the specific shape of the area shown herein, and should include, for example, change in a shape caused in a manufacturing process.

According to some embodiments of the present disclosure, a substrate processing apparatus that performs a dry-cleaning process on a substrate using plasma within a chamber will be described by way of example. However, the present disclosure is not limited thereto and the substrate processing apparatus may perform other types of processes that is able to process the substrate, such as etching, ashing, and deposition processes. According to one embodiment, a plasma process may be a process in which a gas containing nitrogen, hydrogen, and fluorine (F) is fed to a processing space 102 to form $(NHxF)ySiFz$ on an oxide film formed on a substrate W. An annealing process may be a process to remove $(NHxF)ySiFz$. According to another example, the plasma process may be a process in which photoresist is removed from the substrate W, and the annealing process may be a process in which residues are removed from the substrate W.

FIG. 1 is a cross-sectional view showing a substrate processing apparatus 10 according to some embodiments of the present disclosure.

Referring to FIG. 1, the substrate processing apparatus 10 may include a chamber 100, a substrate support unit 200, an electrode unit 300, a controller 400, an exhaust baffle 500, and an exhaust assembly 700.

The chamber 100 has the processing space 102 defined therein in which the substrate W is processed. The chamber 100 is provided in a circular cylindrical shape. A housing of the chamber 100 is made of a metal material. For example, the housing of the chamber 100 may be made of aluminum material. A substrate inlet and outlet 130 is formed in one sidewall of the chamber 100. The substrate is brought into the processing space through the substrate inlet and outlet 130. The substrate inlet and outlet 130 may be opened and closed by a door 140. An exhaust port 150 is installed in a bottom of the chamber 100. The exhaust port 150 may be positioned to coincide with a central axis of the chamber 100. The exhaust port 150 functions as a discharge hole through which by-products generated in the processing space 102 are discharged out of the chamber 100. The exhaust port 150 is connected to the exhaust assembly 700. The gas is exhausted from the processing space by the exhaust assembly 700, and a vacuum atmosphere may be created in the processing space 102.

The substrate support unit 200 supports the substrate W thereon while being disposed in the processing space. The substrate support unit 200 may be embodied as an electrostatic chuck that supports the substrate W thereon using an electrostatic force. Optionally, the substrate support unit 200 may support the substrate W thereon using various schemes such as mechanical clamping.

Figure 2:
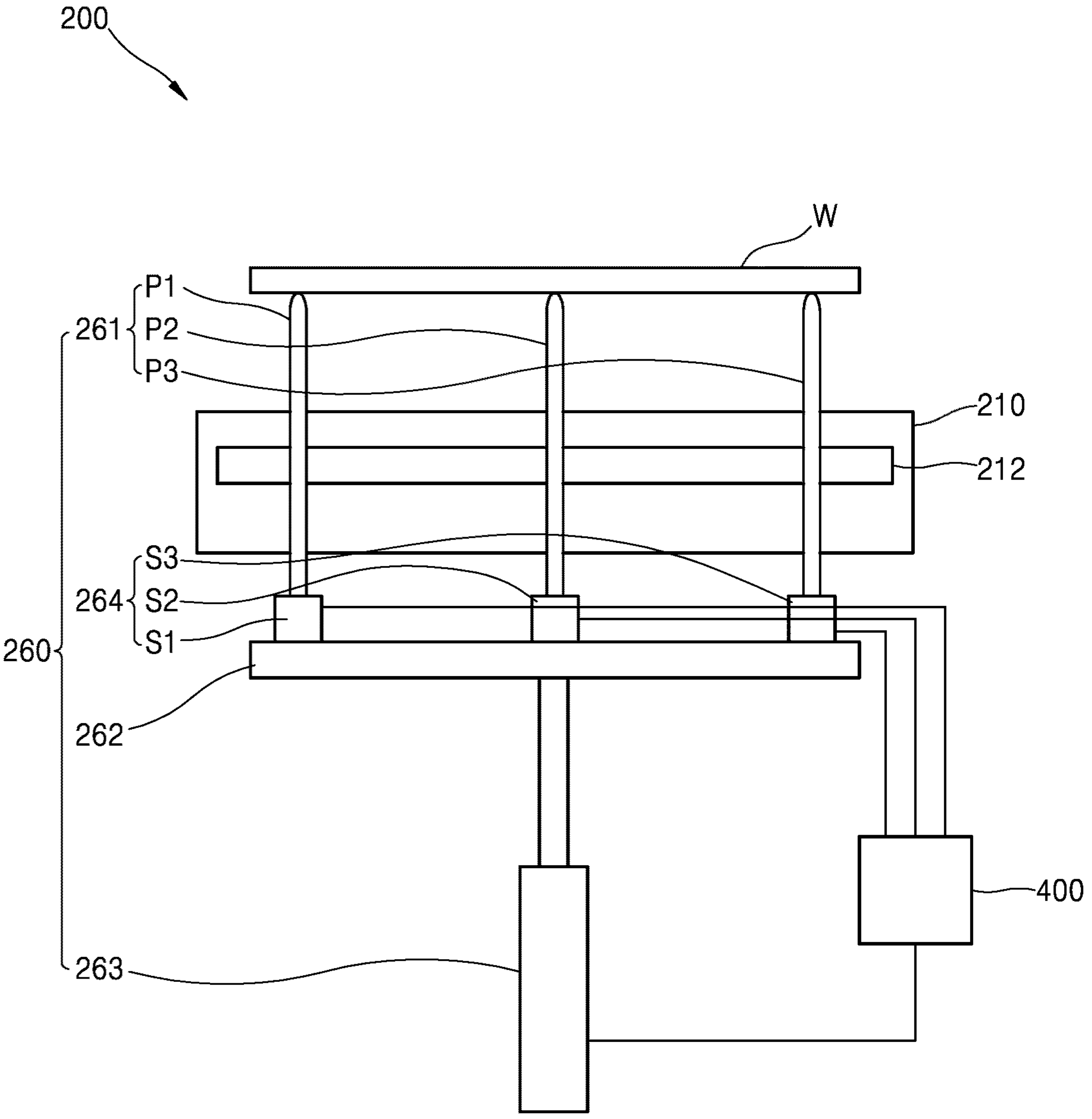
FIG. 2 is a cross-sectional view showing a substrate lifting device of a substrate support unit of the substrate processing apparatus in FIG. 1.

The electrostatic chuck 200 includes an electrostatic chuck body 210, a focusing ring 252, an edge ring 254, a lower electrode 230, and a lift pin 261 (see FIG. 2). The substrate W is placed directly on an upper surface of the electrostatic chuck body 210. The electrostatic chuck body 210 is provided in a disk shape. For example, the electrostatic chuck body 210 may be made of a ceramic material. The electrostatic chuck body 210 may have a smaller radius than that of the substrate W. The chucking electrode 212 is installed inside the electrostatic chuck body 210. A power source (not shown) is connected to the chucking electrode 212, which receives a voltage from the power source. The chucking electrode 212 provides the electrostatic force based on the applied voltage so that the substrate W is adsorbed to the electrostatic chuck body 210. A heater 214 is installed inside the electrostatic chuck body 210 to heat the substrate W. The heater 214 may be located under the chucking electrode 212. The heater 214 may be embodied as a spiral-shaped coil. The lower electrode 230 supports the electrostatic chuck body 210. The lower electrode 230 is located under the electrostatic chuck body 210 and is fixedly coupled to the electrostatic chuck body 210.

An upper surface of the lower electrode 230 has a stepped shape so that a vertical level of a top of a central area thereof is higher than that of a top of an edge area thereof. The upper surface of the lower electrode 230 has the central area of a size corresponding to an area size of a bottom surface of the electrostatic chuck body 210. A cooling fluid path 232 is formed inside the lower electrode 230. The cooling fluid path 232 is embodied as a passage through which a cooling fluid circulates. The cooling fluid path 232 may be provided in a spiral shape inside the lower electrode 230. An externally located high frequency power source may be connected to the lower electrode 230, or the lower electrode 230 may be grounded. The lower electrode 230 may be made of a metal material. The high frequency power source 240 may apply power to the lower electrode 230 and control ion energy incident on the substrate. The high frequency power source 240 may provide high frequency bias power.

The focusing ring 252 focuses the plasma onto the substrate W. The focusing ring 252 is provided in an annular ring shape surrounding the electrostatic chuck body 210. The focusing ring 252 is located on an edge area of the electrostatic chuck body 210. For example, the focusing ring 250 may be made of a conductive material. An upper surface of the focusing ring 252 may be provided in a stepped manner. An upper surface of an inner portion of the focusing ring 252 has the same vertical level as that of an upper surface of the electrostatic chuck body 210, and supports the edge area of a bottom surface of the substrate W.

The edge ring 254 is provided in an annular ring shape surrounding the focusing ring 252. The edge ring 254 is located adjacent to the focusing ring 252 and on the edge area of the lower electrode 230. An upper surface of the edge ring 254 has a higher vertical level than that of the upper surface of the inner portion of the focusing ring 252. The edge ring 254 may be made of an insulating material.

The electrode unit 300 may be embodied as a capacitively coupled plasma source. The electrode unit includes an upper electrode 310, an upper showerhead 330, and a lower showerhead 350.

A first space 320 is formed between the upper electrode 310 and the upper showerhead 330. The first space 320 is connected to a first gas supply unit 360 that supplies first process gas. The first gas supply unit 360 includes a first gas supply pipe 361 and a flow rate adjustment member 363.

A second space 340 is formed between the upper showerhead 330 and the lower showerhead 350. The second space 340 is connected to a second gas supply unit 370 that supplies second process gas.

A high frequency power source 341 is connected to the upper electrode 310. The high frequency power source 341 applies high frequency power to the upper electrode 310. The first process gas supplied from the first gas supply unit 360 may be a single component gas or a mixed gas of two or more components. The first process gas contains gas, radicals, ions, or electrons. An electromagnetic field generated between the upper electrode 310 and the upper showerhead 330 excites the first process gas provided into the first space 320 into a plasma state. In accordance with the present disclosure, for convenience of the descriptions, the plasma generated in the first space 320 is defined as first plasma.

The upper showerhead 330 is disposed between the first space 320 and the second space 340, and acts as a boundary between the first space 320 and the second space 340. The upper showerhead 330 is made of a conductive material. The upper showerhead 330 is provided in a plate shape. For example, the upper showerhead 330 may have a disk shape. A plurality of through-holes 331 are formed in the upper showerhead 330. The through-holes 331 vertically extend through the upper showerhead 330. The first plasma passes through the through-holes 331 of the upper showerhead 330 and flows into the second space 340.

The second space 340 is a space where plasma is generated from the first plasma and the second process gas. In accordance with the present disclosure, the plasma generated in the second space is defined as second plasma.

The second gas supply unit 370 includes a second gas supply pipe 371 and a flow rate adjustment member 373. The second gas supply pipe 371 of the second gas supply unit 360 may branch into a plurality of branch pipes which extend through the upper showerhead 330 and are uniformly distributed on an upper surface of the second space 340 and communicate with the second space 340. In another example, the second gas supply unit 360 may be provided in one wall of the second space 340. The second process gas may be a gas with the same composition as that of the first process gas or a gas with a different composition from that of the first process gas. The second process gas may be a single component gas or a mixed gas of two or more components. The second process gas supplied from the second gas supply unit 360 and the first plasma flowing from the first space 320 through the upper showerhead 330 into the second space 340 react with each other to generate the second plasma in the second space 340.

The lower showerhead 350 has a plate shape. The lower showerhead 350 is made of a conductive material. According to one example, the lower showerhead 350 may be made of a material including silicon. A bottom surface of the lower showerhead 350 is exposed to the processing space. A plurality of distribution holes 351 are formed in the lower showerhead 350. Each distribution hole 351 extends vertically. Some of ions or electrons or radicals of the second plasma are distributed to the processing space through the distribution holes 351.

The lower showerhead 350 is located on top of the support unit 200. The lower showerhead 350 is positioned to face the electrostatic chuck body 210. The plasma that has passed through the lower showerhead 350 is uniformly supplied to the processing space 102 within the chamber 100.

The lower showerhead 350 includes a heater 356. The heater 356 is installed in the lower showerhead 350 and heats the lower showerhead 350. The heater 356 is electrically connected to a power source 355 and receives power therefrom.

An annealing gas supply unit 380 includes an annealing gas supply pipe 381, a heater 385, and a flow rate control member 383. The annealing gas supply pipe 381 is connected to the second gas supply pipe 371. The annealing gas supply pipe 381 may be installed separately from the second gas supply pipe 371. The annealing gas supply pipe 281 supplies heated gas to the second space 340. The annealing gas supplied to the second space 340 passes through the distribution holes 351 of the lower showerhead 350 and then is distributed to the processing space.

The controller 400 controls a flow rate of each of the first process gas, the second process gas, and the annealing gas. The controller 400 controls each of the flow rate adjustment members 363, 373, and 383. According to one example, the flow rate of the process gas supplied to the first space 320 and the flow rate of the process gas supplied to the second space 340 may be controlled to be different from each other. According to one example, the supply of the first process gas and the second process gas is stopped, and the annealing gas is supplied thereto to anneal the substrate.

The exhaust baffle 500 exhausts the plasma uniformly on an area basis from the processing space. The exhaust baffle 500 is located in the processing space and between an inner sidewall of the chamber 100 and the substrate support unit 200. The exhaust baffle 500 is provided in an annular ring shape. A plurality of through-holes 502 are formed in the exhaust baffle 500. The through-holes 502 extend through the exhaust baffle 500. The through-holes 502 are arranged along a circumferential direction of the exhaust baffle 500. The through-hole 502 has a hole shape or a slit shape in a length direction as a radial direction of the exhaust baffle 500.

The exhaust assembly 700 exhausts the atmosphere of the processing space 102. The exhaust assembly 700 may generate a vacuum atmosphere in the processing space 102. By-products generated during the process and the plasma remaining in the chamber 100 are discharged out of the chamber through the exhaust assembly 700.

The exhaust assembly 700 includes an exhaust line 710, a decompression pump 720, and a valve unit 800. The exhaust line 710 is connected to an exhaust port 150 formed in a bottom wall of the chamber 100. The decompression pump 720 is installed in the exhaust line 710 and decompresses the exhaust line 710. The valve controller 810 controls opening and closing of the valve unit 800.

The valve unit 800 is installed in the exhaust line 710 and between the exhaust port 150 and the decompression pump 720. The valve unit 800 controls a pressure of gas exhausted from the processing space 102. The controller 810 may control the valve unit 800.

A notification device 900 may output various information output from the controller 400 so that an operator may identify the information. The notification device 900 may be embodied as a display device, a warning light, or a light-emitting element.

Figure 3:
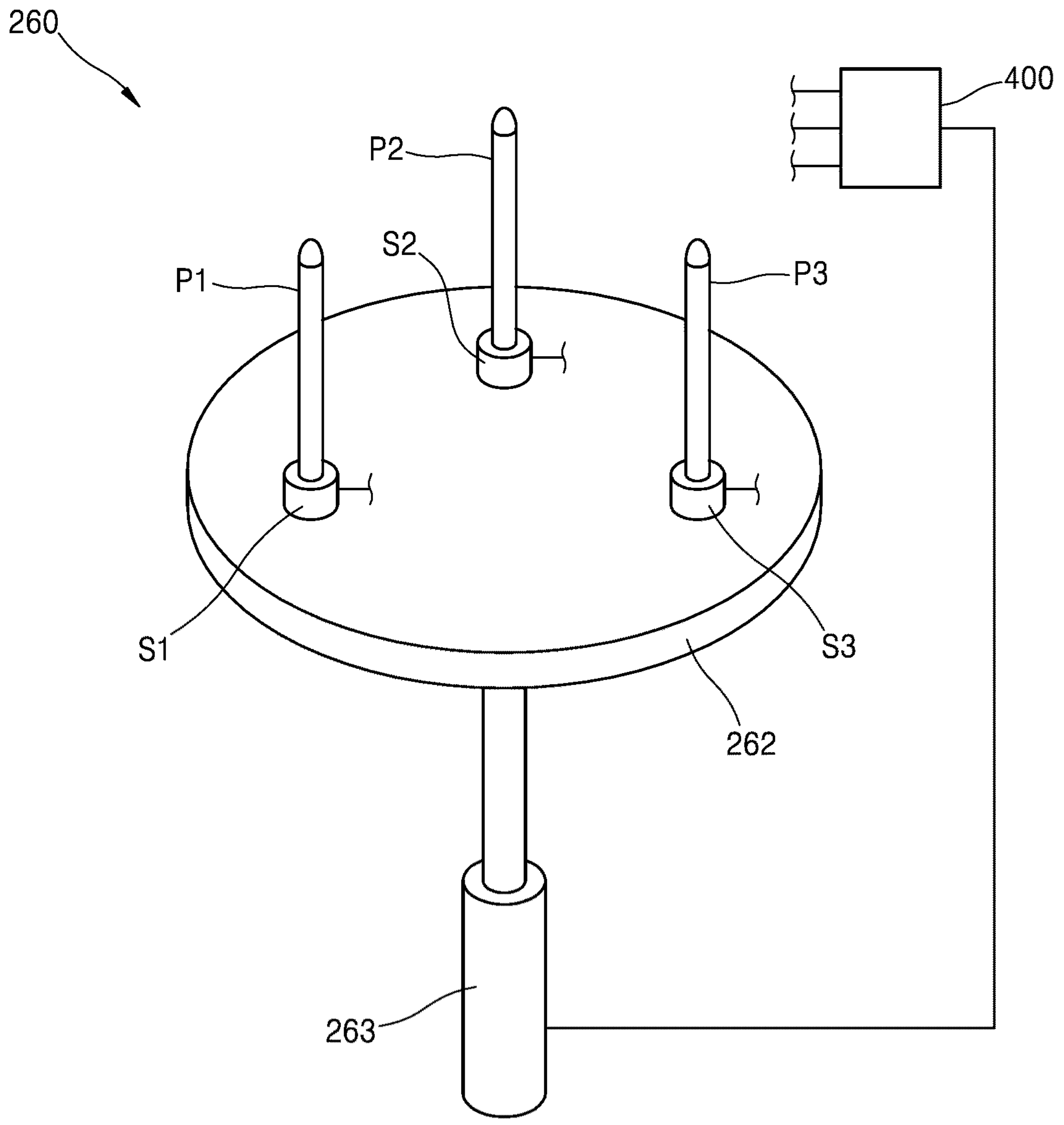
FIG. 3 is a perspective view showing the substrate lifting device of the substrate support unit in FIG. 2.

FIG. 2 is a cross-sectional view showing a substrate lifting device 260 of the substrate support unit 200 of the substrate processing apparatus 10 in FIG. 1. FIG. 3 is a perspective view showing the substrate lifting device 260 of the substrate support unit 200 in FIG. 2.

As shown in FIG. 2 and FIG. 3, the substrate support unit 200 of the substrate processing apparatus 10 according to some embodiments of the present disclosure may include the electrostatic chuck body 210 capable of chucking the substrate W using an electrostatic force, the chucking electrode 212 installed inside the electrostatic chuck body 210, the substrate lifting device 260 installed at the electrostatic chuck body 210, and a controller 400 that applies a control signal to the substrate lifting device 260. In the loading operation of the substrate W, the substrate lifting device 260 rises up such that the substrate W is seated thereon. In an unloading operation of the substrate W, the substrate lifting device 260 raises up the substrate W from the electrostatic chuck body 210.

The substrate lifting device 260 may include at least one lift pin 261 that is in contact with the substrate W, a lift pin moving table 262 that supports the lift pin 261 thereon and is installed to be vertically movable, a moving table lifting device 263 that vertically moves the lift pin moving table 262, and a load measurement device 264 installed between the lift pin 261 and the lift pin moving table 262 and capable of measuring a load of the substrate W applied to the lift pin 261.

The load measurement device 264 may include a load cell or a strain gauge having a resistance pattern whose resistance value changes when being deformed by a load.

The strain gauge is not affected by plasma charges, etc., and may very stably and precisely measure the load applied to the lift pin.

Before unloading the substrate W, the controller 400 may be embodied as a circuit unit, a circuit board, a microprocessor, a computing unit, a central processing unit, a storage device storing therein a program, a computer, a server computer, a smartphone, a smart pad, a smart device, an electronic device, an electronic component, a semiconductor chip, or an integrated circuit which may apply a preliminarily ascend control signal to the moving table lifting device 263 to preliminarily raise up the lift pin 261 to a de-chucking check vertical level H3 (see FIG. 6) to allow a de-chucked state of the substrate W to be identified.

In this regard, the de-chucking check vertical level H3 may be a vertical level within an elastic deformation range of the substrate W as a range in which the substrate W is raised up such that the substrate W is not damaged from a state in which the substrate W has been chucked on the electrostatic chuck body 210.

When the lift pin 261 has been preliminarily raised up to the de-chucking check vertical level H3 (see FIG. 6), the controller 400 receives load measurement information from the load measurement device 264 and compares the received information with a reference value, and outputs de-chucking state information based on the comparing result. When the load measurement information is within a range of the reference value, the de-chucking state may be determined as a de-chucking success state. When the load measurement information exceeds the reference value, the de-chucking state may be determined as a de-chucking fail state. When the load measurement information is smaller than the above reference value, this state may be determined as a substrate escape state.

Accordingly, when the load measurement information deviates from the reference value, the controller 400 may apply a lift pin movement stop control signal to the moving table lifting device 263 and may apply a notification signal to the notification device 900.

In addition to the function of identifying the de-chucked state of the substrate W as described above, the controller 400 may receive the load measurement information from the load measurement device 264 to identify an aligned state of the substrate W when loading the substrate W, and may compare the received information with a reference value, and may determine a substrate presence/absence state, a substrate escape state, or a substrate alignment state based on the comparing result, and may output the determination result through the notification device 900.

As shown in FIG. 2 and FIG. 3, the at least one lift pin 261 of the substrate lifting device 260 of the substrate support unit 200 of the present disclosure may include a first pin P1, a second pin P2 and a third pin P3 arranged so as to triangularly support the substrate W thereon. In addition, the number of the lift pins 264 may include a variety of numbers, such as, for example, six.

In this regard, the load measurement device 264 may include a first load cell S1 installed under the first pin P1, a second load cell S2 installed under the second pin P2, and a third load cell S3 installed under the third pin P3.

The controller 400 may compare first load measurement information received from the first load cell S1, second load measurement information received from the second load cell S2, and third load measurement information received from the third load cell S3 with one another, and may determine whether the first load measurement information, the second load measurement information, and the third load measurement information are distributed in an equal manner to one another within an allowed range, and may determine the presence/absence state, the aligned state, or the de-chucked state of the substrate W based on the determination result, and then may output the determined presence/absence state, aligned state, or de-chucked state of the substrate W.

For example, when all of the first load measurement information, the second load measurement information, and the third load measurement information is below an allowed substrate presence/absence determination range, the controller 400 may determine this state as the absence of the substrate.

In addition, for example, when only the first load measurement information is below the allowed substrate presence/absence determination range, and each of the second load measurement information, and the third load measurement information satisfies the substrate presence/absence determination range, the controller 400 may determine this state as a partial escape state of the substrate.

FIG. 4 to FIG. 7 are cross-sectional views showing, step by step, an operation process of the substrate lifting device 260 of the substrate support unit 200 in FIG. 2.

Figure 4:
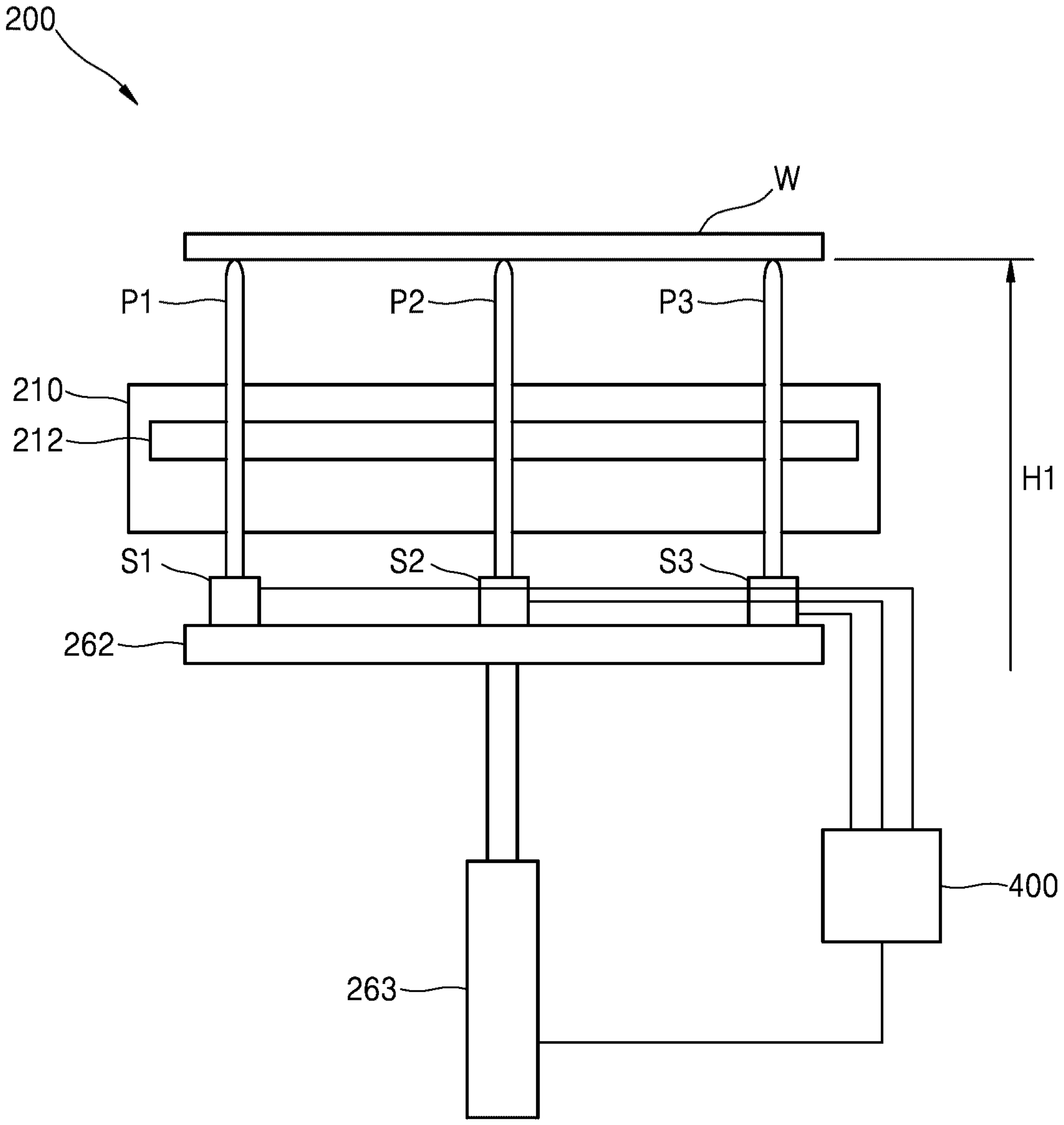
FIG. 4 to FIG. 7 are cross-sectional views showing, step by step, an operation process of the substrate lifting device of the substrate support unit in FIG. 2.

As shown in FIG. 4 to FIG. 7, the operation process of the substrate lifting device 260 of the substrate support unit 200 of the substrate processing apparatus 10 according to the embodiments of the present disclosure will be described step by step as follows. First, as shown in FIG. 4, the lift pins P1, P2, and P3 may be raised up to a loading vertical level H1, and the substrate W may be loaded onto the raised substrate lifting device 260.

At this time, the controller 400 may receive load measurement information from the load measurement device 264 installed under the lift pins 261 in order to identify the aligned state of the substrate W, and may compare the received information with a reference value, and may determine the aligned state of the substrate W or the presence/absence state of the substrate W based on the comparing result, and may output the determined aligned state or presence/absence state of the substrate W.

That is, the controller 400 may compare the first load measurement information received from the first load cell S1 installed under the first pin P1, the second load measurement information received from the second load cell S2 installed under the second pin P2, and the third load measurement information received from the third load cell S3 installed under the third pin P3 with one another, and may determine, based on the comparing result, whether the first load measurement information, the second load measurement information, and the third load measurement information are distributed in an equal manner to one another within the allowed range, and accordingly, may determine the presence/absence state or the aligned state of the substrate W, based on the determination result, and then may output the determined presence/absence state or aligned state of the substrate W.

Figure 5:
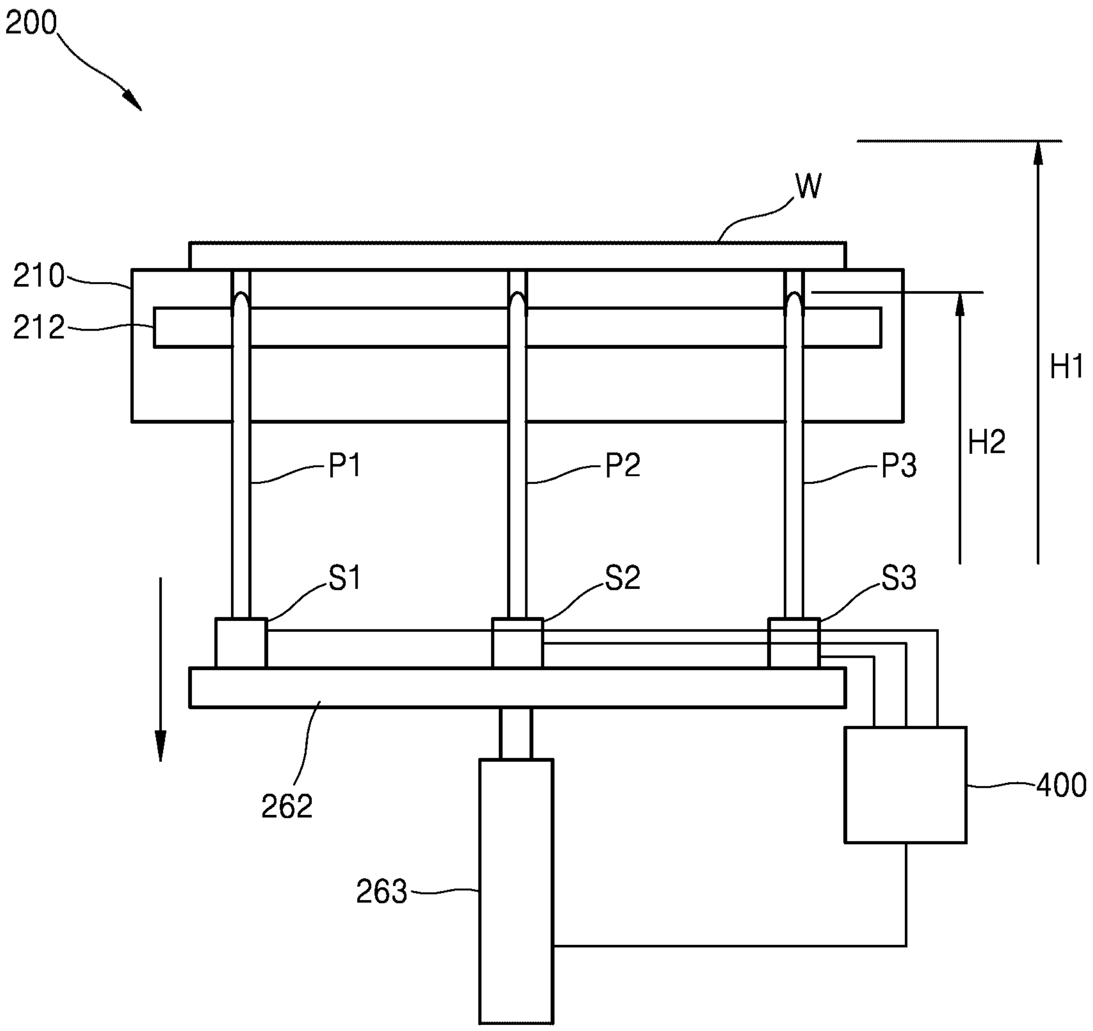

Next, as shown in FIG. 5, when the substrate W is present and the aligned state is normal, the lift pins 254 of the substrate lifting device 260 may be lowered down to a process vertical level H2 so that the substrate W may be chucked onto the electrostatic chuck body 210 using the electrostatic force. Thus, a process may proceed.

Figure 6:
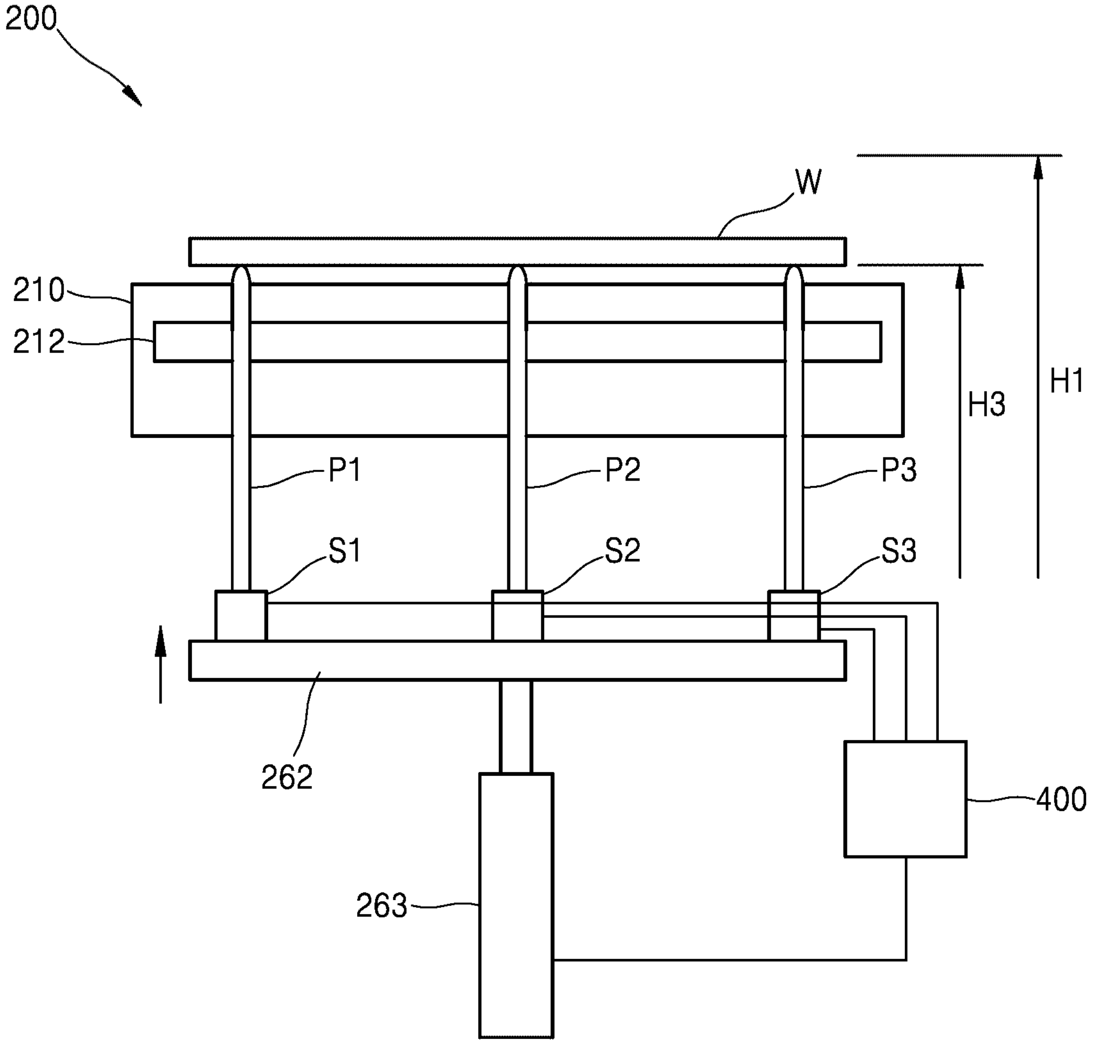

Subsequently, as shown in FIG. 6, after completing the process of processing the substrate W, the electrostatic force of the electrostatic chuck body 210 may be released to de-chuck the substrate W therefrom.

Subsequently, the substrate W may be preliminarily raised up to the de-chucking check vertical level H3 using the substrate lifting device 260 to identify the de-chucked state of the substrate W.

In this regard, the de-chucking check vertical level H3 may be a vertical level within an elastic deformation range of the substrate W as a range in which the substrate W is raised up such that the substrate W is not damaged from a state in which the substrate W has been chucked on the electrostatic chuck body 210.

When the lift pin 261 has been preliminarily raised up to the de-chucking check vertical level H3, the controller 400 may receive the load measurement information from the load measurement device 264 installed under the lift pins 261, and may compare the received information with the reference value, and may determine the de-chucked state of the substrate W based on the comparing result, and may output the determined de-chucked state.

More specifically, for example, when the load measurement information is within the range of the reference value, the controller 400 may determine this state as the de-chucking success state. When the load measurement information exceeds the reference value, the controller 400 may determine this state as the de-chucking fail state. When the load measurement information is smaller than the reference value, the controller 400 may determine this state as the substrate escape state.

Accordingly, when the load measurement information deviates from the reference value, the controller 400 may stop the movement of the moving table lifting device 263 and output the notification signal to the notification device 900.

Furthermore, in this regard, the controller 400 may compare the first load measurement information received from the first load cell S1 installed under the first pin P1, the second load measurement information received from the second load cell S2 installed under the second pin P2, the third load measurement information received from the third load cell S3 installed under the third pin P3 with one another, and determine, based on the comparing result, whether all of partial electrostatic forces in all directions have been released, and may output the determination result as the de-chucked state information of the substrate W.

For example, when the third load measurement information is abnormal, the controller 400 may determine that the partial electrostatic force around the third pin P3 still remains and a de-chucking fail occurs.

Figure 7:
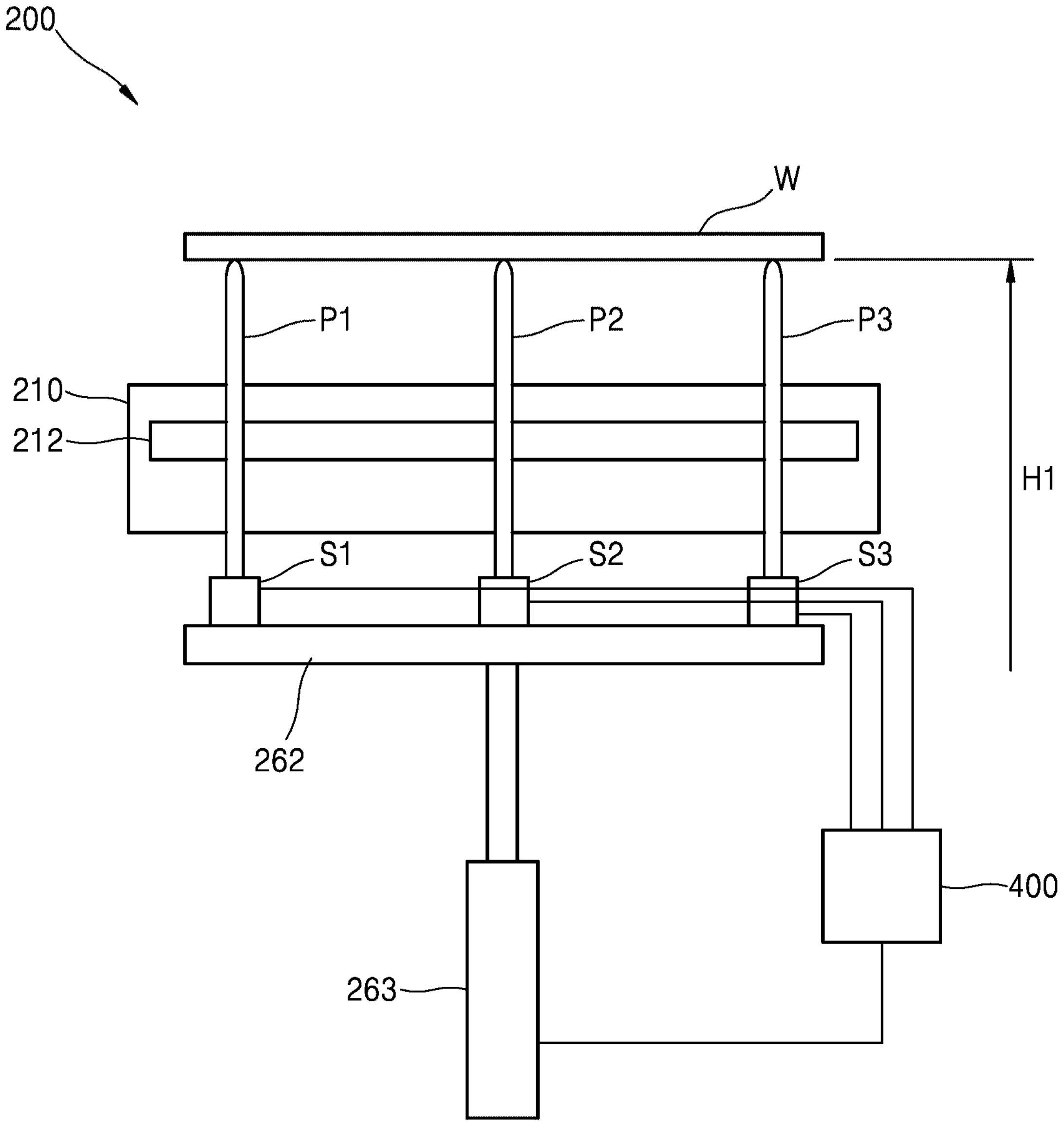

Next, as shown in FIG. 7, when all of the first to third load measurement information are abnormal, the controller 400 may raise up the substrate lifting device 260 so that the substrate W which has been successfully de-chucked is unloaded from the substrate support unit. Thus, the substrate W is lifted from the electrostatic chuck body 210 to an initial loading vertical level H1, that is, an unloading vertical level.

Therefore, according to the present disclosure, the controller may preliminarily raise the substrate W before unloading the same and measure the load applied to the lift pin 264, and may identify the de-chucking state based on the measurement result. The controller may compare the loads respectively applied to the triangularly arranged lift pins P1, P2, and P3 with one another, and upon determination that the loads are not uniform or one of the loads is not applied, may determine this state as the substrate escape or absence state of the substrate. Thus, the reliability of the substrate chucking apparatus may be greatly improved.

Figure 8:
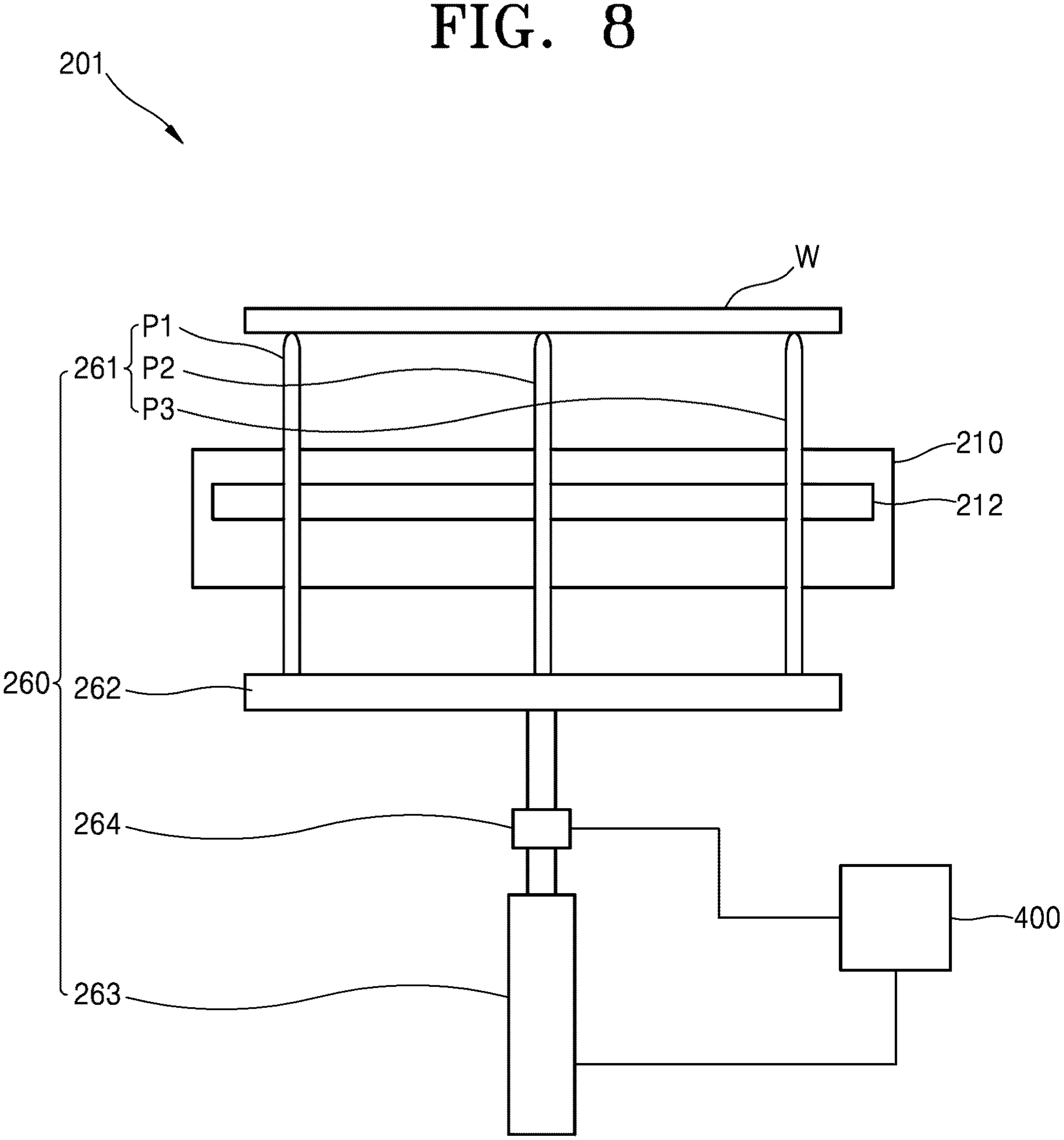
FIG. 8 is a cross-sectional view showing a substrate lifting device of a substrate support unit according to some further embodiments of the present disclosure.

FIG. 8 is a cross-sectional view showing the substrate lifting device 260 of the substrate support unit 201 according to some further embodiments of the present disclosure.

As shown in FIG. 8, in the substrate lifting device 260 of the substrate support unit 201 according to some further embodiments of the present disclosure, the load measurement device 264 may be disposed between the lift pin moving table 262 and the moving table lifting device 263.

Therefore, the load measurement device 264 may measure the loads respectively applied to the lift pins P1, P2, and P3 in an integrated manner. The controller 400 may use the load measurement information to determine the presence/absence state of the substrate W, the aligned state of the substrate W, the de-chucked state of the substrate W, etc.

Figure 9:
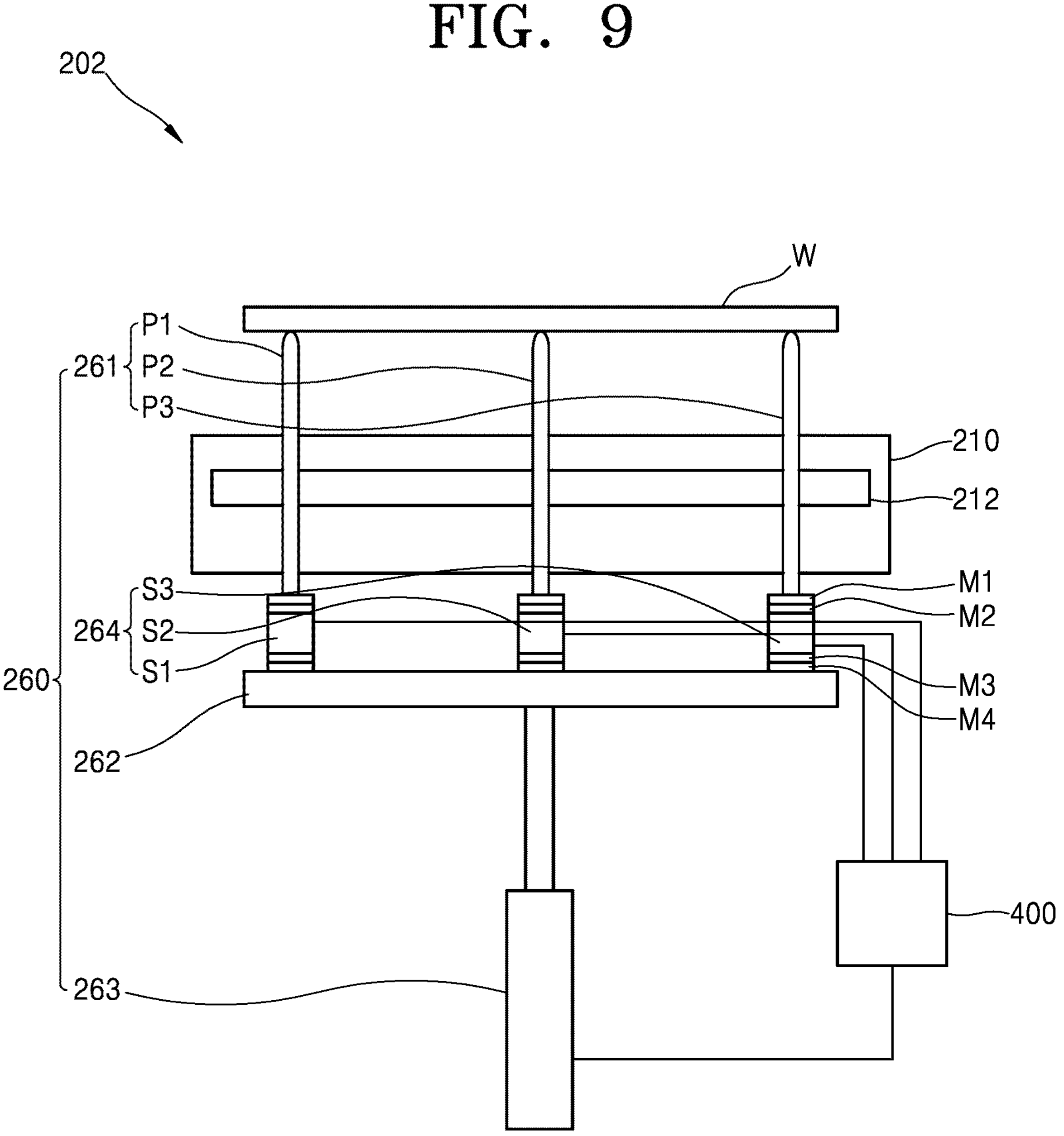
FIG. 9 is a cross-sectional view showing a substrate lifting device of a substrate support unit according to some still further embodiments of the present disclosure.

FIG. 9 is a cross-sectional view showing a substrate lifting device of the substrate support unit 202 according to some still further embodiments of the present disclosure.

As shown in FIG. 9, in the substrate lifting device 260 of the substrate support unit 202 according to some still further embodiments of the present disclosure, in order to allow the load measurement device 264 to be replaced or removed as necessary under a magnetic force, a first magnet M1 may be installed under the lift pin 261. A second magnet M2 that exerts an attractive force toward the first magnet M1 may be installed on an upper surface of the load measurement device 264. A third magnet M3 may be installed under a lower surface of the load measurement device 264. A fourth magnet M4 that exerts an attractive force toward the third magnet M3 may be installed on a top face of the lift pin moving table 262.

Therefore, when the equipment has been set up or a process condition has been set, the load measurement device 264 may be removed. Alternatively, when necessary, the load measurement device 264 may be very easily attached or detached.

Figure 10:
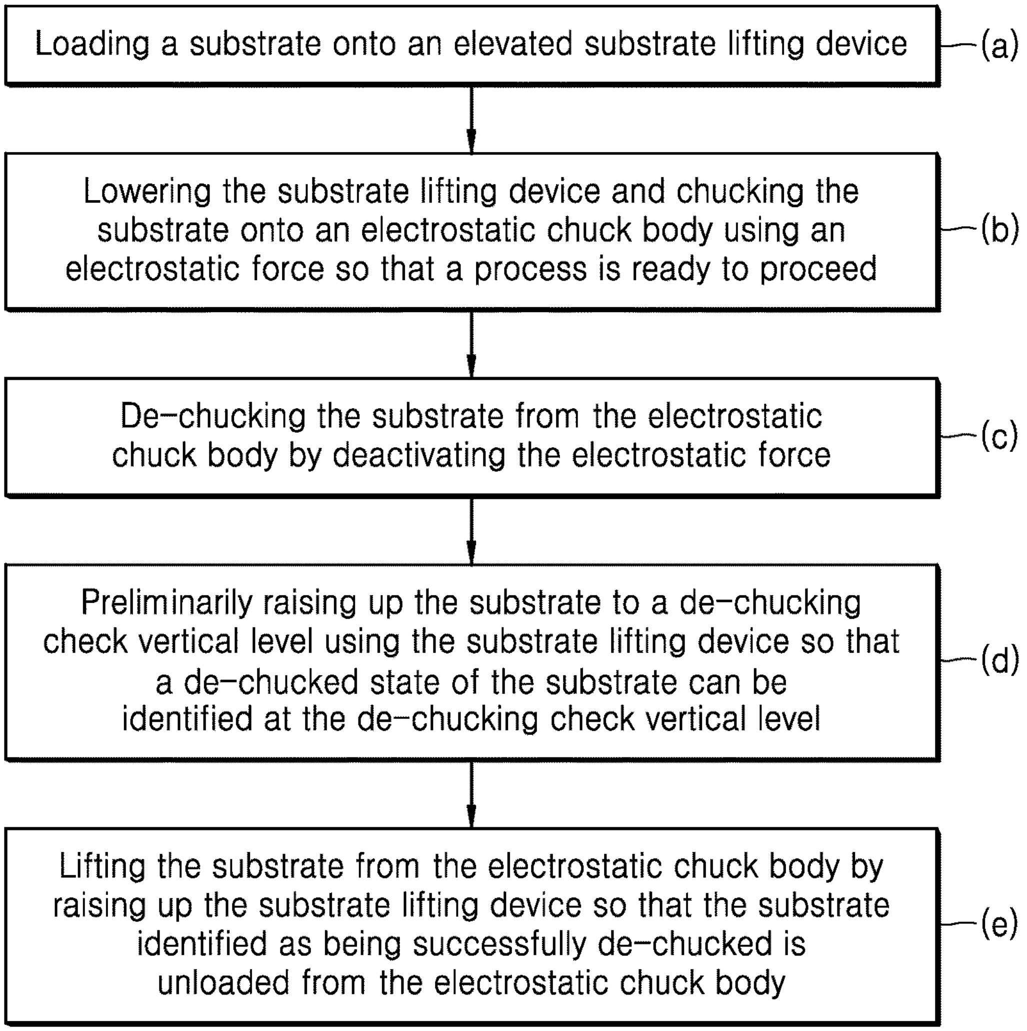
FIG. 10 is a flowchart showing a substrate processing method according to some embodiments of the present disclosure.

FIG. 10 is a flowchart showing a substrate processing method according to some embodiments of the present disclosure.

As shown in FIG. 1 to FIG. 10, the substrate processing method according to some embodiments of the present disclosure may include (a) loading the substrate W onto the raised substrate lifting device 260, (b) lowering the substrate lifting device 260 and chucking the substrate W onto the electrostatic chuck body 210 using the electrostatic force so that the process may proceed; (c) de-chucking the substrate W therefrom by deactivating the electrostatic force of the electrostatic chuck body 210; (d) preliminarily raising the substrate W to the de-chucking check vertical level H3 using the substrate lifting device 260 so that the de-chucked state of the substrate W may be identified; and (e) lifting the substrate W from the electrostatic chuck body 210 by raising up the substrate lifting device 260 so that the substrate W which has been successfully de-chucked may be unloaded therefrom.

In this regard, in step (d), the de-chucking check vertical level H3 may be a vertical level within an elastic deformation range of the substrate W as a range in which the substrate W is raised up such that the substrate W is not damaged from a state in which the substrate W has been chucked on the electrostatic chuck body 210.

In step (d), when the lift pin 261 has been preliminarily raised up to the de-chucking check vertical level H3 (see FIG. 6), the controller 400 receives load measurement information from the load measurement device 264 and compares the received information with a reference value, and outputs de-chucking state information based on the comparing result. When the load measurement information is within a range of the reference value, the de-chucking state may be determined as a de-chucking success state. When the load measurement information exceeds the reference value, the de-chucking state may be determined as a de-chucking fail state. When the load measurement information is smaller than the above reference value, this state may be determined as a substrate escape state.

In step (d), when the load measurement information deviates from the reference value, the controller 400 may apply a lift pin movement stop control signal to the moving table lifting device 263 and may apply a notification signal to the notification device 900.

In step (a), the controller 400 may receive the load measurement information from the load measurement device 264 to identify an aligned state of the substrate W when loading the substrate W, and may compare the received information with a reference value, and may determine a substrate presence/absence state, a substrate escape state, or a substrate alignment state based on the comparing result, and may output the determination result through the notification device 900.

In step (a), the controller 400 may compare the first load measurement information received from the first load cell S1, the second load measurement information received from the second load cell S2, and the third load measurement information received from the third load cell S3 with one another, and may determine whether the first load measurement information, the second load measurement information, and the third load measurement information are distributed in an equal manner to one another within an allowed range, and may determine the presence/absence state, the aligned state, or the de-chucked state of the substrate W based on the determination result, and then may output the determined presence/absence state, aligned state, or de-chucked state of the substrate W.

In step (d), the controller 400 may compare the first load measurement information received from the first load cell S1, the second load measurement information received from the second load cell S2, and the third load measurement information received from the third load cell S3 with one another, and may determine whether the first load measurement information, the second load measurement information, and the third load measurement information are distributed in an equal manner to one another within an allowed range, and may determine the presence/absence state, the aligned state, or the de-chucked state of the substrate W based on the determination result, and then may output the determined presence/absence state, aligned state, or de-chucked state of the substrate W.

The present disclosure has been described with reference to the embodiments shown in the drawings, but this is merely illustrative, and those skilled in the art will understand that various modifications and equivalent further embodiments may be derived therefrom. Therefore, the true scope of technical protection of the present disclosure should be determined based on the technical spirit of the attached patent claims.

What is claimed is:

1. A substrate processing apparatus comprising:
- an electrostatic chuck body configured to chuck a substrate using an electrostatic force;
- a substrate lifting device installed at the electrostatic chuck body and configured to ascend such that the substrate is seated thereon in a substrate loading operation, or to lift the substrate from the electrostatic chuck body in a substate unloading operation; and
- a controller configured to apply a control signal to the substrate lifting device,
- wherein the substrate lifting device includes:
- at least one lift pin movable so as to be in contact with the substrate;
- a lift pin moving table configured to support the at least one lift pin thereon and to be vertically movable;
- a moving table lifting device configured to vertically move the lift pin moving table; and
- a load measurement device installed between the at least one lift pin and the lift pin moving table,
- wherein the load measurement device is configured to measure a load applied to the at least one lift pin.

2. The substrate processing apparatus of claim 1,
- wherein before the substrate unloading operation, the controller is configured to apply a preliminarily ascend control signal to the moving table lifting device to preliminarily raise up the lift pin to a de-chucking check vertical level at which a de-chucked state of the substrate is identified.

3. The substrate processing apparatus of claim 2,
- wherein the de-chucking check vertical level is a vertical level within an elastic deformation range of the substrate as a range in which the substrate is raised up such that the substrate is not damaged from a state in which the substrate has been chucked on the electrostatic chuck body.

4. The substrate processing apparatus of claim 2,
- wherein when the at least one lift pin has been preliminarily raised up to the de-chucking check vertical level, the controller is configured to receive load measurement information from the load measurement device, and to compare the load measurement information with a reference value, and to determine the de-chucked state of the substrate based on the comparing result, and to output the determined de-chucked state.

5. The substrate processing apparatus of claim 4,
- wherein when the load measurement information is within a range of the reference value, the controller is configured to determine that de-chucking of the substate is successful, and
- wherein when the load measurement information exceeds the reference value, the controller is configured to determine that de-chucking of the substate fails.

6. The substrate processing apparatus of claim 5,
- wherein when the load measurement information is smaller than the reference value, the controller is configured to determine that the substrate has escaped from the electrostatic chuck body.

7. The substrate processing apparatus of claim 4,
- wherein when the load measurement information deviates from the reference value, the controller is configured to apply a lift pin movement stop control signal to the moving table lifting device, and to apply a notification signal to a notification device.

8. The substrate processing apparatus of claim 1,
- wherein in the substrate loading operation, the controller is configured to receive load measurement information from the load measurement device, and to compare the received load measurement information with a reference value, and to determine an aligned state of the substrate based on the comparing result, and to output the determined aligned state of the substrate.

9. The substrate processing apparatus of claim 1,
- wherein the load measurement device includes a load cell or a strain gauge with a resistance pattern whose resistance value changes when being deformed under a load.

10. The substrate processing apparatus of claim 1,
- wherein the at least one lift pin includes a first pin, a second pin, and a third pin arranged triangularly to support the substrate triangularly thereon,
- wherein the load measurement device includes:
  - a first load cell installed under the first pin;
  - a second load cell installed under the second pin; and
  - a third load cell installed under the third pin, and
- wherein the controller is configured to:
- compare first load measurement information received from the first load cell, second load measurement information received from the second load cell, and third load measurement information received from the third load cell with one another;

determine whether the first load measurement information, the second load measurement information, and the third load measurement information are distributed in an equal manner to one another within an allowed range;

determine a presence/absence state, an aligned state, and/or a de-chucked state of the substate based on the determination result; and output the determined presence/absence state, aligned state, and/or de-chucked state of the substate.

11. The substrate processing apparatus of claim 1, wherein the substrate lifting device further includes: in order to allow the load measurement device to be replaced or removed as necessary under a magnetic force, a first magnet is installed under the lift pin;

a second magnet exerting an attractive force toward the first magnet is installed on an upper surface of the load measurement device;

a third magnet is installed under a lower surface of the load measurement device; and a fourth magnet exerting an attractive force toward the third magnet is installed on a top face of the lift pin moving table.

12. A substrate processing apparatus comprising:

an electrostatic chuck body configured to chuck a substrate using an electrostatic force;

a substrate lifting device installed at the electrostatic chuck body and configured to ascend such that the substrate is seated thereon in a substrate loading operation, or to lift the substrate from the electrostatic chuck body in a substate unloading operation; and a controller configured to apply a control signal to the substrate lifting device, wherein the substrate lifting device includes:

at least one lift pin movable so as to be in contact with the substrate;

a lift pin moving table configured to support the at least one lift pin thereon and to be vertically movable;

a moving table lifting device configured to vertically move the lift pin moving table; and a load measurement device installed between the at least one lift pin and the lift pin moving table, or installed between the lift pin moving table and the moving table lifting device, wherein the load measurement device is configured to measure a load applied to the at least one lift pin, wherein before the substrate unloading operation, the controller is configured to apply a preliminarily ascend control signal to the moving table lifting device to preliminarily raise up the lift pin to a de-chucking check vertical level at which a de-chucked state of the substrate is identified, wherein the substrate lifting device further includes: in order to allow the load measurement device to be replaced or removed as necessary under a magnetic force, a first magnet is installed under the lift pin;

a second magnet exerting an attractive force toward the first magnet is installed on an upper surface of the load measurement device;

a third magnet is installed under a lower surface of the load measurement device; and a fourth magnet exerting an attractive force toward the third magnet is installed on a top face of the lift pin moving table, wherein the de-chucking check vertical level is a vertical level within an elastic deformation range of the substrate as a range in which the substrate is raised up such that the substrate is not damaged from a state in which the substrate has been chucked on the electrostatic chuck body, wherein when the at least one lift pin has been preliminarily raised up to the de-chucking check vertical level, the controller is configured to receive load measurement information from the load measurement device, and to compare the load measurement information with a reference value, and to determine the de-chucked state of the substrate based on the comparing result, and to output the determined de-chucked state, wherein when the load measurement information is within a range of the reference value, the controller is configured to determine that de-chucking of the substate is successful, wherein when the load measurement information exceeds the reference value, the controller is configured to determine that de-chucking of the substate fails, wherein when the load measurement information is smaller than the reference value, the controller is configured to determine that the substrate has escaped from the electrostatic chuck body, and wherein when the load measurement information deviates from the reference value, the controller is configured to apply a lift pin movement stop control signal to the moving table lifting device, and to apply a notification signal to a notification device.

13. A substrate processing apparatus comprising:

an electrostatic chuck body configured to chuck a substrate using an electrostatic force;

a substrate lifting device installed at the electrostatic chuck body and configured to ascend such that the substrate is seated thereon in a substrate loading operation, or to lift the substrate from the electrostatic chuck body in a substate unloading operation; and a controller configured to apply a control signal to the substrate lifting device, wherein the substrate lifting device includes:

at least one lift pin movable so as to be in contact with the substrate;

a lift pin moving table configured to support the at least one lift pin thereon and to be vertically movable;

a moving table lifting device configured to vertically move the lift pin moving table; and a load measurement device installed between the at least one lift pin and the lift pin moving table, or installed between the lift pin moving table and the moving table lifting device, wherein the load measurement device is configured to measure a load applied to the at least one lift pin, wherein the substrate lifting device further includes: in order to allow the load measurement device to be replaced or removed as necessary under a magnetic force, a first magnet is installed under the lift pin;

a second magnet exerting an attractive force toward the first magnet is installed on an upper surface of the load measurement device;

a third magnet is installed under a lower surface of the load measurement device; and a fourth magnet exerting an attractive force toward the third magnet is installed on a top face of the lift pin moving table.

14. The substrate processing apparatus of claim 13, wherein before the substrate unloading operation, the controller is configured to apply a preliminarily ascend control signal to the moving table lifting device to preliminarily raise up the lift pin to a de-chucking check vertical level at which a de-chucked state of the substrate is identified.

15. The substrate processing apparatus of claim 14, wherein the de-chucking check vertical level is a vertical level within an elastic deformation range of the substrate as a range in which the substrate is raised up such that the substrate is not damaged from a state in which the substrate has been chucked on the electrostatic chuck body.

16. The substrate processing apparatus of claim 14, wherein when the at least one lift pin has been preliminarily raised up to the de-chucking check vertical level, the controller is configured to receive load measurement information from the load measurement device, and to compare the load measurement information with a reference value, and to determine the de-chucked state of the substrate based on the comparing result, and to output the determined de-chucked state.

17. The substrate processing apparatus of claim 16, wherein when the load measurement information is within a range of the reference value, the controller is configured to determine that de-chucking of the substate is successful, and wherein when the load measurement information exceeds the reference value, the controller is configured to determine that de-chucking of the substate fails.

18. The substrate processing apparatus of claim 16, wherein when the load measurement information deviates from the reference value, the controller is configured to apply a lift pin movement stop control signal to the moving table lifting device, and to apply a notification signal to a notification device.

19. The substrate processing apparatus of claim 13, wherein in the substrate loading operation, the controller is configured to receive load measurement information from the load measurement device, and to compare the received load measurement information with a reference value, and to determine an aligned state of the substrate based on the comparing result, and to output the determined aligned state of the substrate.

20. The substrate processing apparatus of claim 13, wherein the at least one lift pin includes a first pin, a second pin, and a third pin arranged triangularly to support the substrate triangularly thereon, wherein the load measurement device includes:

a first load cell installed under the first pin;

a second load cell installed under the second pin; and a third load cell installed under the third pin, wherein the controller is configured to:

compare first load measurement information received from the first load cell, second load measurement information received from the second load cell, and third load measurement information received from the third load cell with one another;

determine whether the first load measurement information, the second load measurement information, and the third load measurement information are distributed in an equal manner to one another within an allowed range;

determine a presence/absence state, an aligned state, and/or a de-chucked state of the substate based on the determination result; and output the determined presence/absence state, aligned state, and/or de-chucked state of the substate.

* * * * *